(12) United States Patent
Zollo et al.

(10) Patent No.: US 7,025,596 B2
(45) Date of Patent: Apr. 11, 2006

(54) METHOD AND APPARATUS FOR SOLDER-LESS ATTACHMENT OF AN ELECTRONIC DEVICE TO A TEXTILE CIRCUIT

(75) Inventors: James A. Zollo, Weston, FL (US); Bonnie J. Bachman, Davie, FL (US); Alan R. Beatty, Plantation, FL (US); Stephen O. Bozzone, Lauderhill, FL (US); Nitin B. Desai, Coral Springs, FL (US); Ronald J. Kelley, Plantation, FL (US); Rami C. Levy, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 53 days.

(21) Appl. No.: 10/867,345

(22) Filed: Jun. 14, 2004

(65) Prior Publication Data

US 2005/0277307 A1    Dec. 15, 2005

(51) Int. Cl.
    *H01R 33/00*    (2006.01)
(52) U.S. Cl. .................. 439/37; 428/102; 442/243; 442/262; 442/265
(58) Field of Classification Search .............. 439/37; 428/102; 442/243, 255, 262, 265, 301
See application file for complete search history.

(56) References Cited

U.S. PATENT DOCUMENTS

| | | | |
|---|---|---|---|
| 4,016,821 A | 4/1977 | Minalga | |
| 4,157,207 A | 6/1979 | Robinson | |
| 4,284,016 A | 8/1981 | Matumura | |
| 4,334,142 A | 6/1982 | Blackmore | |
| 4,535,251 A | 8/1985 | Herman et al. | |
| 4,791,722 A | 12/1988 | Miller, Jr. | |
| 4,831,780 A | 5/1989 | Bockwinkel | |
| 4,868,980 A | 9/1989 | Miller, Jr. | |
| 4,891,912 A | 1/1990 | Bockwinkel | |
| 4,927,366 A * | 5/1990 | Tommerson et al. | 439/37 |
| 4,970,109 A | 11/1990 | Bryant et al. | |
| 5,053,021 A | 10/1991 | Feibus | |
| 5,308,667 A | 5/1994 | Calhoun et al. | |
| 5,328,079 A | 7/1994 | Mathew et al. | |
| 5,366,780 A * | 11/1994 | Rapisarda | 428/102 |
| 5,531,601 A * | 7/1996 | Amoroso | 439/37 |
| 5,569,877 A | 10/1996 | Yumi | |
| 5,968,854 A | 10/1999 | Akopian et al. | |
| 6,160,246 A | 12/2000 | Rock et al. | |
| 6,210,771 B1 * | 4/2001 | Post et al. | 428/100 |

(Continued)

OTHER PUBLICATIONS

E.R. Post et al., "E-broidery: Design and fabrication of textile based computing"; IBM Systems Journal, vol. 39, Nos. 3 & 4, 2000, MIT Media Laboratory, http://www.research.ibm.com/journal/sj/393/part3/post.html.

*Primary Examiner*—Gary F. Paumen

(57) ABSTRACT

A method and apparatus form electrical connections between electronic circuits and conductive threads (102, 104, 106, 108) that are interwoven into textile material (130). Electronic circuits (128), such as semiconductor dies, are connected to a carrier (132) and electrical connections (136) are made to conductive connection areas (110, 112, 114, 116) on the carrier (132). Conductive stitching (202, 204, 206, 208) provides electrical contacts for both the conductive connection areas (110, 112, 114, 116) on the carrier (132) and the conductive threads (102, 104, 106, 108) that are interwoven into the textile material (130). Optionally, a thin, flexible substrate material (132) is perforated during the stitching process.

14 Claims, 5 Drawing Sheets

U.S. PATENT DOCUMENTS

| | | |
|---|---|---|
| 6,373,034 B1 | 4/2002 | Rock et al. |
| 6,414,286 B1 | 7/2002 | Rock et al. |
| 6,501,055 B1 | 12/2002 | Rock et al. |
| 6,531,687 B1 | 3/2003 | Michelmann |
| 6,561,814 B1 * | 5/2003 | Tilbury et al. ............... 439/37 |
| 6,564,449 B1 | 5/2003 | Tsai et al. |
| 6,729,025 B1 * | 5/2004 | Farrell et al. ............... 29/854 |
| 2003/0211797 A1 * | 11/2003 | Hill et al. ................... 442/205 |
| 2004/0009729 A1 * | 1/2004 | Hill et al. ................... 442/208 |

* cited by examiner

METHOD AND APPARATUS FOR SOLDER-LESS ATTACHMENT OF AN ELECTRONIC DEVICE TO A TEXTILE CIRCUIT

FIELD OF THE INVENTION

The present invention generally relates to the field of electrical connections and more specifically to electrical connections formed in or associated with textile materials.

BACKGROUND OF THE INVENTION

Applications for electronic circuits include connecting electronic circuits to conductors within textile materials. Textile materials, such as commonly available fabrics, are able to include electronic circuits for a variety of purposes. One such application includes "wearable electronics" whereby electronic circuits are attached to or embedded into clothing. These electronic circuits can be connected to conductive threads woven into the cloth of the clothing to provide electrical interfaces between those electronic circuits and other components, such as switches or other input/output devices.

An obstacle to the cost effective construction of such wearable electronic circuits is that it is difficult to connect the electronic components, such as integrated circuits, to conductive threads sewn into the textile garment. Conductive threads create efficient "wearable wires," but connecting these wires to devices has been difficult to do in an efficient and cost effective manner that is sufficiently robust to withstand being worn and washed. Solutions that use solder and/or printed circuit boards further complicate and restrict the design and construction of low-cost and practical clothing.

Therefore a need exists to overcome the problems with the prior art as discussed above.

SUMMARY OF THE INVENTION

In accordance with an exemplary embodiment of the present invention, an electronic circuit module arrangement has an electronic circuit module with at least one connection point and a carrier that is sewn through by forming perforations in the carrier during a passing of a thread through the carrier. The electronic circuit module arrangement further has at least one connection areas where each of the at least one connection areas is in mechanical contact with the carrier and in electrical coupling with the at least one connection point.

In accordance with another aspect of the present invention, an electrical circuit connection has a carrier that is sewn through. The electrical circuit connection further has at least one connection areas where each of the at least one connection areas is in mechanical contact with the carrier. The electrical circuit connection also has a textile material with at least one interwoven conductive thread that is a part of the textile material. The electrical connection further has at least one conductive stitching where each of the at least one conductive stitching consists of conductive material and is, for example, woven, knitted, and/or stitched through the carrier and the textile material so as to form an electrical connection between one of the at least one connection areas and one of the at least one interwoven conductive thread.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms as described in the non-limiting exemplary embodiments of FIGS. 1 through 4. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term woven, as used herein, is defined to include but is not limited to woven, knitted, stitched, or embroidered.

Figure 1:
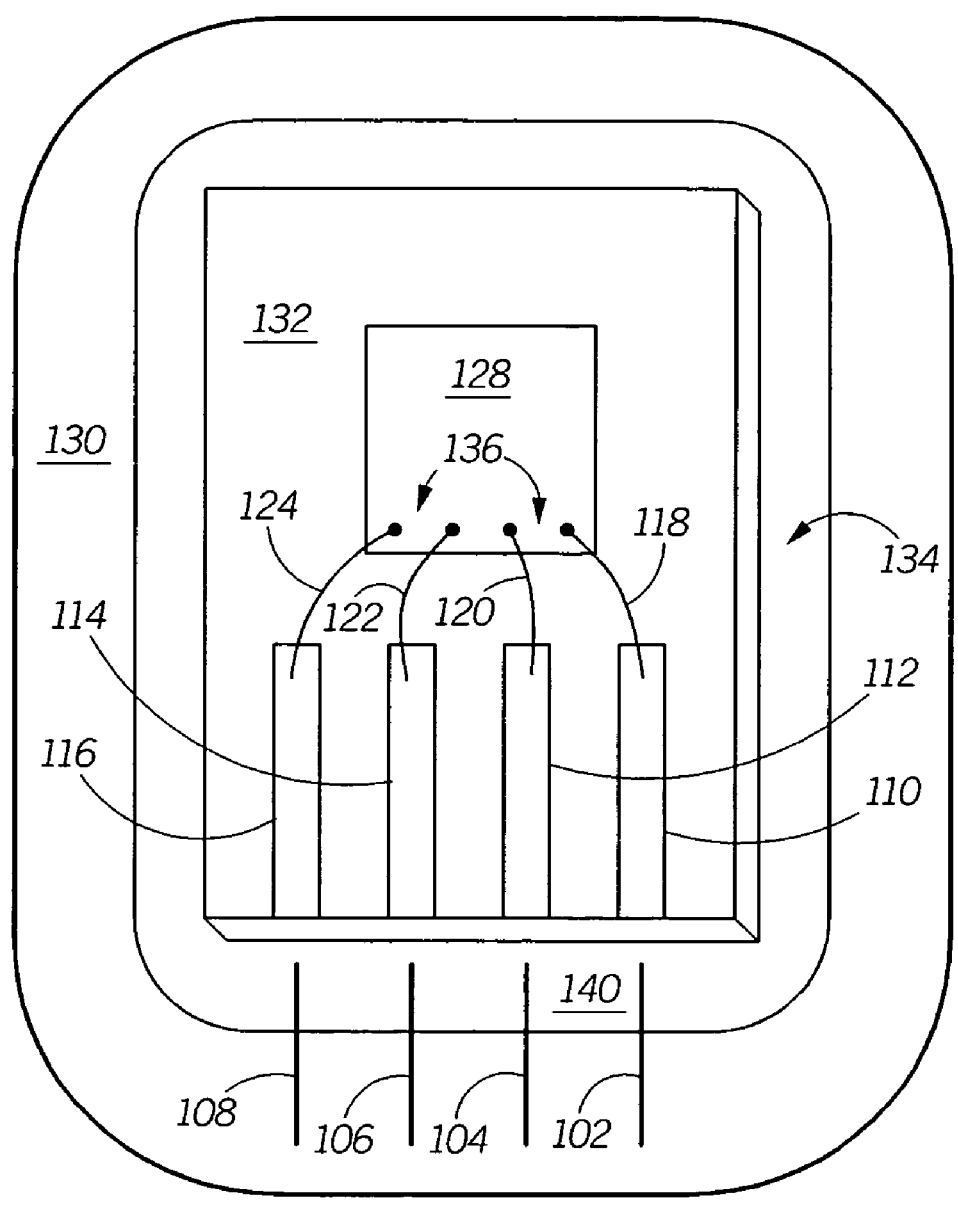
FIG. 1 illustrates an unattached carrier 100 prior to attachment to a textile material, according to an exemplary embodiment of the present invention.

FIG. 1 illustrates an unattached carrier 100 prior to attachment to a textile material, according to an exemplary embodiment of the present invention. The exemplary unattached carrier 100 illustrates a textile material 130 with four conductive threads interwoven therein. A first conductive thread 102, a second conductive thread 104, a third conductive thread 106 and a fourth conductive thread 108 are interwoven conductive threads that are a part of the textile material shown in this example. Further embodiments of the present invention incorporate textile material with only one interwoven conductive thread or any number of interwoven conductive threads that are used to convey electrical power and/or signals to a circuit, as is described below.

The textile material 130 of the exemplary embodiment is a conventional material made of any of the numerous materials adapted for fabrics. It is clear that any suitable material is able to be used in embodiments of the present invention. Textile materials can be woven from, for example and without limitation, cotton, polyester, wool, and other such materials. Interwoven conductive threads, such as the first conductive thread 102, are formed in an exemplary embodiment of carbon fiber. Further embodiments include interwoven conductive threads that include copper, silver and/or gold conductors. Such threads are able to be solid or stranded metallic threads or cloth insulating threads that include intermixed conductive materials to form a conductive circuit path. These interwoven conductive threads are able to be accurately woven into textile material by, for example, conventional or modified embroidery machines. Interwoven conductive threads woven into the textile material 130 are able to have an insulating coating or be uninsulated. Some embodiments that use uninsulated conductive threads (i.e., lacking an insulating cover), such as the first conductive thread 102, use the textile material 130 as a liner that is either sandwiched between two or more other layers of textile material or that is a backing for a single layer of material that forms an outer layer of an article.

The unattached carrier 100 further illustrates a circuit arrangement and assembly 134 that includes a carrier 132 and a circuit element 128. Circuit element 128 in this exemplary embodiment is an electronic circuit formed on a single silicon integrated circuit die. This circuit element 128 of the exemplary embodiment is itself an unpackaged integrated circuit die that is not encapsulated in an insulating material. Further embodiments include encapsulated electronic circuit elements, such as silicone integrated circuits encapsulated in epoxy. Further embodiments include electronic circuits that consist of several integrated circuits, discrete components, and/or other electronic circuit elements. The electronic circuits in some embodiments of the present invention are attached to the carrier 132.

The circuit element 128 of the exemplary embodiment has a number of electrical connection points 136, as is known by ordinary practitioners in the relevant arts. Each of the electrical connection points 136 in the exemplary embodiment forms a separate electrical connection to the electronic circuitry within the circuit element 128 and has a wire bond connected thereto, such as a first wire bond 118, a second wire bond 120, a third wire bond 122 and a fourth wire bond 124. Each of the wire bonds are connected to a corresponding connection area. The connection areas in the exemplary embodiment are conductive traces deposited on either surface of carrier 132 and are therefore in physical contact with the carrier 132. The wire bonds place the corresponding connection point (136) in electrical coupling with a corresponding connection area of the electronic circuit arrangement. The unattached carrier 100 includes of a first conductive trace 110, a second conductive trace 112, a third conductive trace 114, and a fourth conductive trace 116 that are each a connection area. Further embodiments of the present invention use different techniques, such as conductive epoxy, solders, ultrasonic bonding of bumps and other known techniques for direct chip attachment, to electrically connect the electrical connection points 136 on the electronic circuit 128 to the plated traces. It is to be noted that plated traces are able to be made of any conductive trace material. These traces can be plated, etched conductive materials, sputtered, printed, or formed by other means to create an electrically defined conductor. The connection areas in further embodiments of the present invention are embedded into, and therefore in contact with, the carrier of those embodiments, and electrical connections to these connection areas are made by sewing conductive thread through that carrier where the connection areas are located.

Carrier 132 of the exemplary embodiment is made of a thin, flexible substrate material. Carrier 132 of the exemplary embodiment is made of a Polyimide flexible circuit substrate. Further embodiments use carriers made of different materials, including but not limited to paper, Mylar, reinforced epoxy or other electrically based dielectric materials. Yet further embodiments use more rigid carriers, such as thin FR4 carriers. Carrier 132 of this exemplary embodiment is able to be sewn through by sewing a thread through the carrier material. When being sewn in such a manner, perforations are formed in the carrier 132 when the thread is passed through the carrier 132. Such sewing is performed, for example, by common embroidery machines. Conductive threads are sewn through the carrier 132 to form electrical connections, as is described below, and conductive or non-conductive thread are able to be sewn through the carrier 132 to provide physical attachment of the carrier 132, as well as the circuit assembly 134, to a textile material 130.

The textile material 130 of the exemplary embodiment has a substrate area 140 that is formed on the surface or within the textile material. A substrate area 140 is used in some, but not all, embodiments of the present invention to provide a more physically stable area onto which the circuit assembly 134 is to be mounted. The substrate area 140 is generally placed in an area proximate, such as adjacent to, an area of the textile material where a carrier 132 is secured to the textile material 130 or a conductive stitching is woven through the carrier 132 and the textile material 130, as is discussed in more detail below.

In further embodiments of the present invention, a substrate area 140, which can be a plastic coated, fabric, impregnated fabric, or any other surface such as a label, patch, etc., formed on a surface of textile material 130 is itself used as a carrier that is similar to carrier 132. Using substrate area 140 as a carrier allows further economization of costs and reduction of manufacturing complexity. Some embodiments that use a substrate area 140 as a carrier form connection areas, similar to the first plated trace 110, onto the substrate area 140 by a metallization process, such as vacuum metallization. Further embodiments of the present invention fabricate carrier 132 directly onto the textile material 130 and do not have a separate substrate area 140.

Figure 2:
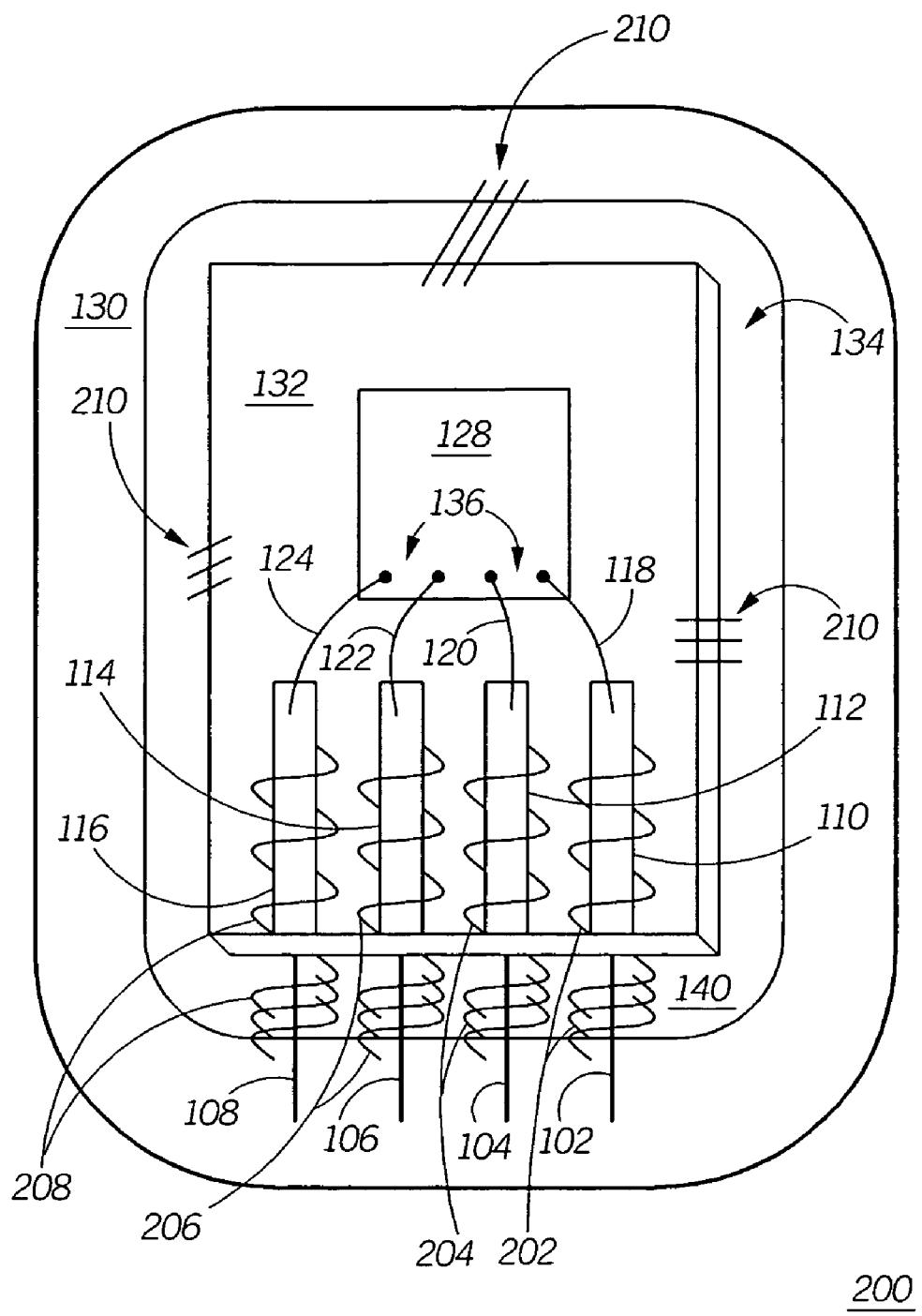
FIG. 2 illustrates an attached sewn-through carrier 200 according to an exemplary embodiment of the present invention.

FIG. 2 illustrates an attached sewn-through carrier 200 according to an exemplary embodiment of the present invention. The attached sewn-through carrier 200 illustrates the configuration of the unattached carrier 100 after electrical connections are formed between the interwoven conductive threads, such as the first conductive thread 102, and corresponding connection areas of the circuit assembly 134. The conductive stitching includes a thread that consists entirely or in part of one or more conductive materials, is used in this exemplary embodiment to form these electrical connections. A first conductive stitching 202 connects the first conductive trace 110 and the first conductive thread 102. The first conductive stitching 202 is a two string stitching as is commonly used for stitching in conventional fabrics. Further embodiments are able to use single thread or multiple thread conductive stitching to form conductive stitching. The first conductive stitching 202 of the exemplary embodiment uses carbon fiber that is sewn through both the carrier 132 and textile material 130 and positioned so as to be in conductive and physical contact with both the first conductive thread 102 and the first conductive trace 110. This stitching thereby forms a conductive path and electrical connection between the first conductive thread 102 and the first conductive trace 110.

Further embodiments utilize other conductive strings or wires to form conductive stitching. A second conductive stitching 204 similarly forms a conductive contact between the second conductive thread 104 and the second conductive contact 112, thus creating a separate circuit between the electronic circuit 128 and conductive threads in the textile material 130. A third conductive stitching 206 and a fourth conductive stitching 208 similarly form independent and electrically isolated contacts between their respective conductive threads and conductive contacts. In addition to the conductive stitching used to form electrical connections with the circuit assembly 134, further stitching 210, which can be formed with conductive or non-conductive thread, is able to be used to further mechanically secure the circuit assembly 134, in particular the carrier 132, to the textile material 130.

Figure 3:
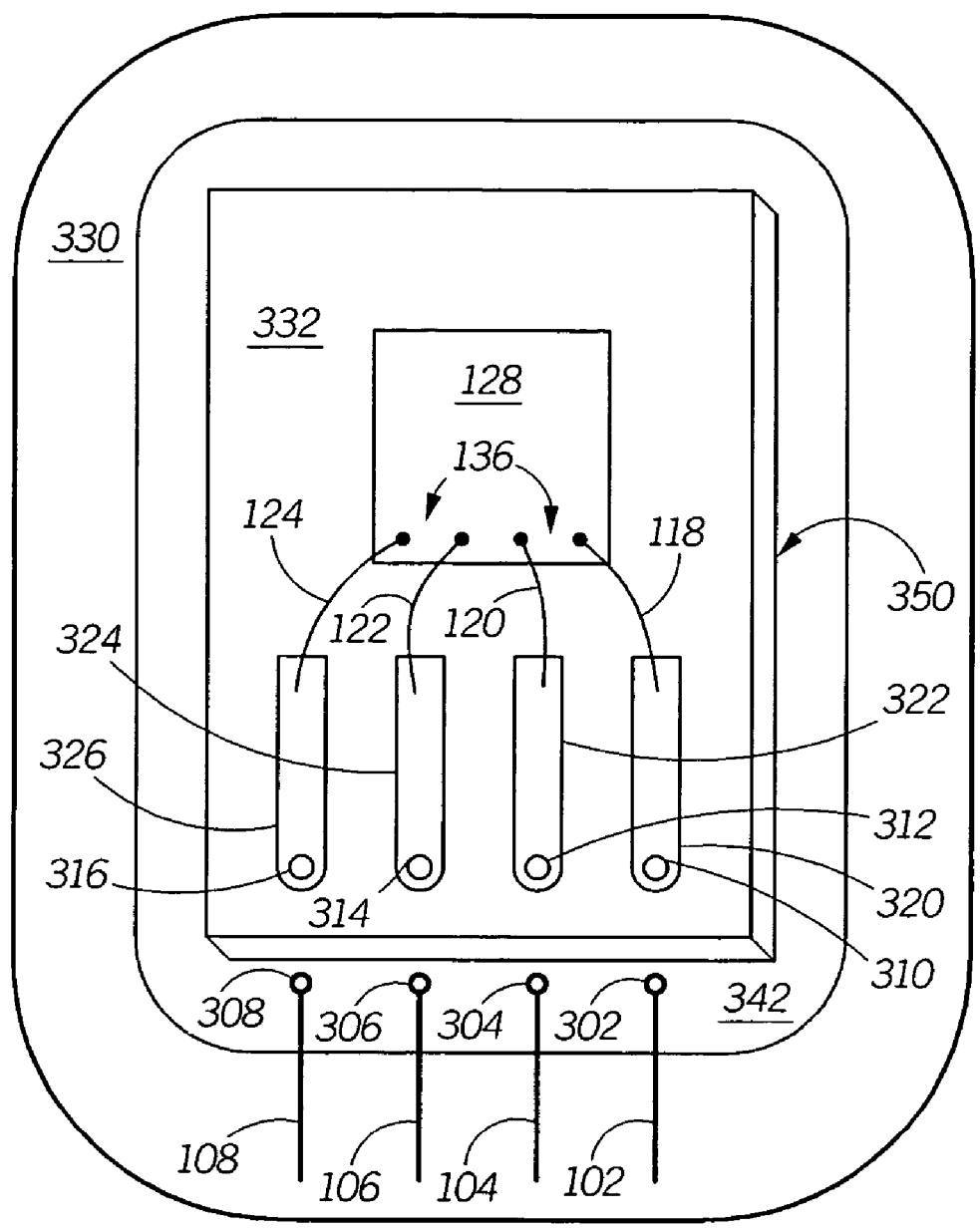
FIG. 3 illustrates an unattached hole-connection carrier 300 according to an exemplary alternative embodiment of the present invention.

FIG. 3 illustrates an unattached hole-connection carrier 300 according to an exemplary alternative embodiment of the present invention. The unattached hole-connection carrier 300 is similar to the unattached sewn-through connection carrier 100 with the exemption of the structure of the electrical connection between the conductive threads within textile material 330 and the electrical connection points 136 within the electronic circuit 128. The connection points 136 in this alternative embodiment are connected to the conductive traces with via by wire bonds. Further embodiments connect the connection points to the plated traces with via by other means, such as conductive epoxy, solders, ultrasonic bonding of bumps and other techniques for direct chip attachment.

Each of the conductive traces with via, such as the first conducive trace with via 320, consists of a first conductive trace 340 that is terminated with a pre-formed first conductive, through-hole via 310 that is within the connection area formed by the first conductive trace with via 320. The first conductive trace 340 of the exemplary alternative embodiment is a conductive trace formed from copper or any conductive trace material, and can be formed as plated, etched conductive materials, sputtered, printed, or through any other technique to create an electrically defined conductor. The first conductive trace 340 is formed on the surface of carrier 332 and is therefore in physical contact with the carrier 332. Further embodiments incorporate conductive traces that are formed within carrier 332. The first conductive, through-hole via 310 of the exemplary embodiment is a pre-formed hole within the carrier 332 that is conductive along its walls, and on the top and bottom surfaces. Further embodiments of the present invention have only one of the top and bottom surfaces that consist of conductive material, while the other surface is non-conductive. The first conductive, through-hole via 310 of the exemplary embodiment has conductive pads attaching the hole on each surface of the carrier 332. Further embodiments have conductive pads on only one surface. The conductive material of the through hole via structure on the surfaces and hole walls facilitates effective electrical connection to the plated trace by threads woven through the hole 310.

The textile material 330 of the exemplary embodiment has conductive threads, such as the first conductive thread 102, woven therein. The ends of the conductive threads are terminated with button holes, such as the first conductive thread 102 that is terminated with a first button hole 302. Button holes in the exemplary embodiment are sewn into the textile material 330 with conductive thread that is in physical and conductive contact with one of the conductive threads woven into the textile material. The second conductive thread 104 similarly has a second button hole 304. The third conductive thread 106 and the fourth conductive thread 108 also have third button hole 306 and a fourth button hole 308, respectively.

Figure 4:
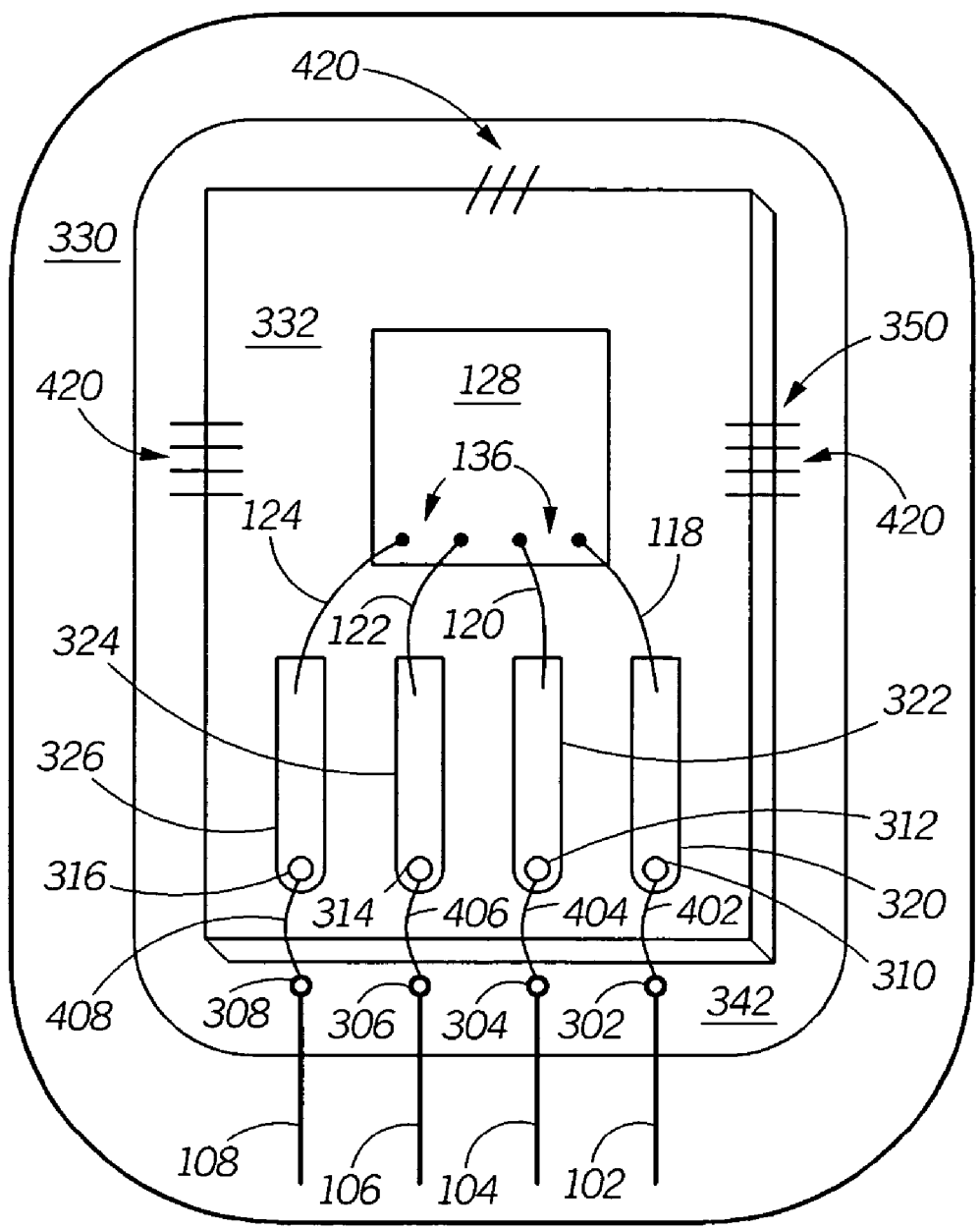
FIG. 4 illustrates an attached hole-connection carrier 400 according to the alternative exemplary embodiment of the present invention.

FIG. 4 illustrates an attached hole-connection carrier 400 according to the alternative exemplary embodiment of the present invention. The attached hole-connection carrier 400 illustrates that conductive thread is sewn with a button stitch through the conductive, through-hole vias and the button holes so as to form an electrical connection from the conductive threads that are woven into the textile material 330 and the connection points 136 of the electronic circuit 128. For example, a first button stitch 402 is sewn through by passing a thread through the pre-formed first button hole 302 and the first conductive, through-hole via 310. The other conductive threads and conductive, through hole vias are physically and electrically connected with other button stitches. It is to be noted that each button stitch is physically isolated from other button stitches and forms a separate connection to a conductive thread woven into the textile material 330. The button stitches are formed in the exemplary alternative embodiment from carbon thread using button stitching techniques that are familiar to ordinary practitioners in the relevant arts, such as tailoring. The exemplary alternative embodiment further incorporates physical stitching 420, which can be made from conductive or non-conductive thread, to physically secure the carrier 332 to the textile material 330.

Figure 5:
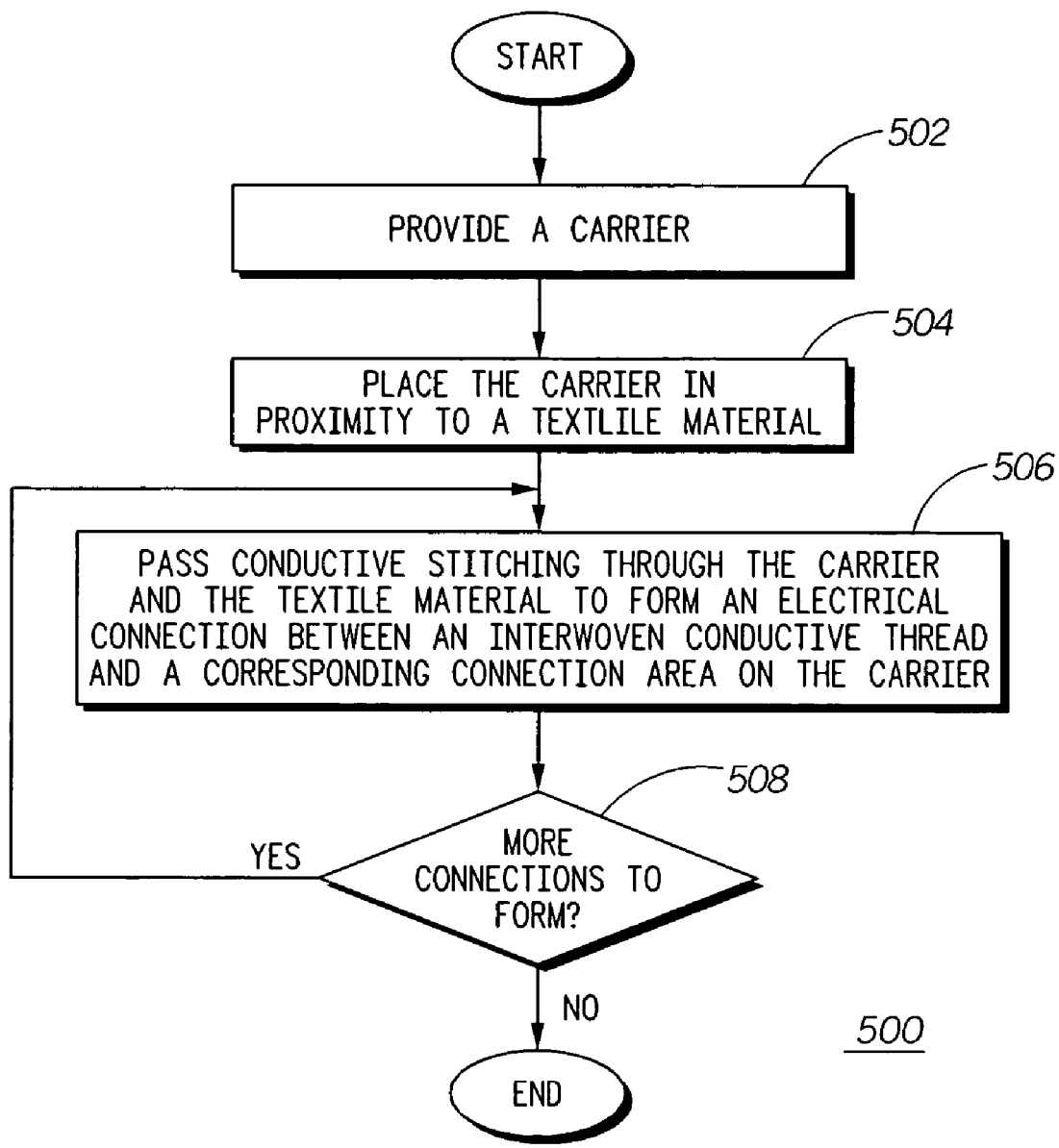
FIG. 5 illustrates a processing flow diagram for implementing a method for connecting two electrical circuits in accordance with the present invention.

FIG. 5 illustrates a processing flow diagram for implementing a method for connecting two electrical circuits in accordance with the present invention. The processing for this embodiment begins by providing, at step 502, a carrier, such as carrier 132, that is able to be sewn through. As discussed above, the carrier 132 has a number of connection areas, such as the first conductive trace 110, that are in physical contact with the carrier. The processing then places, at step 504, the carrier, such as carrier 132, in proximity to a textile material, such as textile material 130. As discussed above, the textile material has one or more interwoven conductive threads attached to the textile material. The processing then passes, at step 506, conductive stitching, such as first conductive stitching 202, through the carrier, such as carrier 132, and the textile material, such as textile material 130, so as to form an electrical connection between the connection areas and corresponding interwoven conductive thread. As discussed above, the conductive stitching comprises a conductive material. The processing then determines, at step 508, if there are more electrical connections to form. If there are more electrical connections to form, the processing returns to passing, at step 506, conductive stitching to form the next electrical connection. If there are no more electrical connections to form, the processing then terminates.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An electrical circuit connection, comprising:
   a carrier that is able to be sewn through by stitching;
   at least one connection areas, each of the at least one connection areas in mechanical contact with the carrier;
   a textile material;
   at least one interwoven conductive thread that is a part of the textile material; and
   at least one conductive stitching, each of the at least one conductive stitching comprising a conductive material and being woven through the carrier and the textile material so as to form an electrical connection between one of the at least one connection areas and one of the at least one interwoven conductive thread.

2. The electrical circuit connection according to claim 1, further comprising an electronic circuit with at least one electrical connection point, the at least one electrical connection point being electrically coupled with one of the at least one connection areas.

3. The electrical circuit connection according to claim 1, wherein the carrier is for sewing through by passing thread through at least one perforation in the carrier.

4. The electrical circuit connection according to claim 1, wherein the carrier is for sewing through by passing thread through at least one pre-formed hole.

5. The electronic circuit connection according to claim 4, wherein the at least one pre-formed hole is within one of the at least one connection areas.

6. The electronic circuit connection according to claim 1, wherein the interwoven conductive thread lacks an electrically insulating cover.

7. The electronic circuit connection according to claim 6, wherein the textile material is placed adjacent to at least one other textile material layer.

8. The electronic circuit connection according to claim 6, wherein the textile material has a plasticized area proximate to an area where the carrier is secured to the textile material.

9. The electronic circuit connection according to claim 6, wherein the textile material has a substrate area proximate to an area where at least some of the at least one conductive stitching is woven through the textile material.

10. The electronic circuit connection according to claim 6, wherein the carrier comprises a substrate area formed on a surface of the textile material.

11. A method for connecting two electrical circuits, the method comprising:
providing a carrier that is able to be sewn through, the carrier having at least one connection areas, each of the at least one connection areas in mechanical contact with the carrier;
placing the carrier in proximity to a textile material, the textile material having at least one interwoven conductive thread attached to the textile material; and
passing at least one conductive stitching through the carrier and the textile material so as to form an electrical coupling between one of the at least one connection areas and one of the at least one interwoven conductive thread, wherein each of the at least one conductive stitching comprises a conductive material.

12. The method of claim 11, further comprising:
electrically coupling at least one electrical contact paint of an electronic circuit module with the at least one connection areas.

13. The method of claim 12, further comprising:
mechanically securing the electronic circuit module to the carrier.

14. The method of claim 13, further comprising:
mechanically securing the electronic circuit module to the textile material.

* * * * *

UNITED STATES PATENT AND TRADEMARK OFFICE
CERTIFICATE OF CORRECTION

PATENT NO. : 7,025,596 B2  Page 1 of 1
APPLICATION NO. : 10/867345
DATED : April 11, 2006
INVENTOR(S) : James A. Zollo It is certified that error appears in the above-identified patent and that said Letters Patent is hereby corrected as shown below:

Column 8, line 20, "paint" should be changed to --point--.

Signed and Sealed this

Twenty-second Day of May, 2007

JON W. DUDAS
*Director of the United States Patent and Trademark Office*